United States Patent [19]

Pedersen et al.

[11] Patent Number: 5,657,206
[45] Date of Patent: Aug. 12, 1997

[54] CONDUCTIVE EPOXY FLIP-CHIP PACKAGE AND METHOD

[75] Inventors: David V. Pedersen, Scotts Valley; Michael G. Finley, Cambria; Kenneth M. Sautter, Sunnyvale, all of Calif.

[73] Assignee: Cubic Memory, Inc., Scotts Valley, Calif.

[21] Appl. No.: 374,421

[22] Filed: Jan. 19, 1995

Related U.S. Application Data

[63] Continuation-in-part of Ser. No. 265,081, Jun. 23, 1994.

[51] Int. Cl.$^6$ .................................... H01R 9/00; H05K 7/02
[52] U.S. Cl. ........................ 361/772; 29/841; 361/760; 361/773; 361/779
[58] Field of Search ........................ 174/260, 261; 257/737, 738, 723, 724, 700; 361/760, 761, 767–770, 773, 774, 779, 820; 437/209, 208, 215; 439/68, 69, 66, 91, 83; 29/841–844

[56] References Cited

U.S. PATENT DOCUMENTS

| | | |
|---|---|---|
| 3,679,941 | 7/1972 | Lacombe et al. . |
| 3,691,628 | 9/1972 | Kim et al. . |
| 3,702,025 | 11/1972 | Archer . |
| 3,769,702 | 11/1973 | Scarbrough . |
| 3,813,773 | 6/1974 | Parks . |
| 3,999,105 | 12/1976 | Archey . |
| 4,300,153 | 11/1981 | Hayakawa et al. . |

(List continued on next page.)

FOREIGN PATENT DOCUMENTS

| | | | |
|---|---|---|---|
| 0010657 | 5/1980 | European Pat. Off. . | |
| 0178227 | 4/1985 | European Pat. Off. . | |
| 0175870 | 4/1986 | European Pat. Off. . | |
| 0558855 | 9/1993 | European Pat. Off. . | |
| 63-56925 | 3/1988 | Japan | 257/738 |
| 8300131 | 5/1983 | WIPO . | |
| 9105478 | 8/1991 | WIPO . | |
| WO93/00703 | 1/1992 | WIPO . | |
| 9306315 | 7/1993 | WIPO . | |
| WO93/23982 | 11/1993 | WIPO . | |
| 93/23982 | 11/1993 | WIPO . | |

OTHER PUBLICATIONS

Wojnarowski, R.J., et al., "Three Dimensional Hybrid Wafer Scale Intergration Using the GE High Density Interconnect Process," *IEEE International Conference on Wafer Scale Integration*, Jan. 20, 1993.

Conte, Al S., "MCM-L The Answer for Desktop Workstations," *ICEMM Proceedings*, (1993) pp. 18–21.

*Primary Examiner*—Donald Sparks
*Attorney, Agent, or Firm*—Trial & Technology Law Group

[57] ABSTRACT

A method and apparatus for producing a multichip package comprising semiconductor chip and a substrate. The semiconductor chip includes conventional inner bond pads that are rerouted to other areas on the chip to facilitate connection with the substrate. The inner bonds are rerouted by covering the chip with a first insulation layer and opening the first insulation layer over the inner bond pads. A metal layer is then disposed over the first insulation layer in contact with the inner bond pads. A second insulation layer is disposed over the metal layer, and the second insulation layer is opened to expose selected portions of the metal layer to form external connection points. Electrically conductive epoxy is then disposed between the external connection points of the semiconductor chip and the terminals of the substrate, thereby electrically connecting the semiconductor chip to the substrate.

15 Claims, 9 Drawing Sheets

U.S. PATENT DOCUMENTS

| | | |
|---|---|---|
| 4,426,773 | 1/1984 | Hargis . |
| 4,525,921 | 7/1985 | Carson et al. . |
| 4,612,083 | 9/1986 | Yasumoto et al. . |
| 4,613,891 | 9/1986 | Ng et al. . |
| 4,646,128 | 2/1987 | Carson et al. . |
| 4,659,931 | 4/1987 | Schmitz et al. . |
| 4,672,737 | 6/1987 | Carson et al. . |
| 4,677,528 | 6/1987 | Miniet . |
| 4,703,170 | 10/1987 | Schmitz . |
| 4,706,166 | 11/1987 | Go . |
| 4,761,681 | 8/1988 | Reid . |
| 4,764,846 | 8/1988 | Go . |
| 4,783,695 | 11/1988 | Eichelberger . |
| 4,801,992 | 1/1989 | Golubic . |
| 4,803,595 | 2/1989 | Kraus et al. . |
| 4,807,021 | 2/1989 | Okumura . |
| 4,827,327 | 5/1989 | Miyauchi et al. . |
| 4,835,593 | 5/1989 | Arnold et al. ............... 257/766 |
| 4,862,249 | 8/1989 | Carlson . |
| 4,894,706 | 1/1990 | Sato et al. . |
| 4,897,708 | 1/1990 | Clements . |
| 4,901,136 | 2/1990 | Neugebauer et al. . |
| 4,907,128 | 3/1990 | Solomon et al. . |
| 4,939,568 | 7/1990 | Kato . |
| 4,941,033 | 7/1990 | Kishida . |
| 4,954,875 | 9/1990 | Clements . |
| 4,956,694 | 9/1990 | Eide . |
| 4,956,695 | 9/1990 | Robinson et al. . |
| 4,956,746 | 9/1990 | Gates, Jr. et al. . |
| 4,959,749 | 9/1990 | Dzarnoski . |
| 4,983,533 | 1/1991 | Go . |
| 4,989,063 | 1/1991 | Kolesar, Jr. . |
| 4,996,583 | 2/1991 | Hatada . |
| 5,006,923 | 4/1991 | Warren . |
| 5,013,687 | 5/1991 | Solomon . |
| 5,019,943 | 5/1991 | Fassbender . |
| 5,025,306 | 6/1991 | Johnson et al. . |
| 5,028,986 | 7/1991 | Sugano et al. . |
| 5,032,896 | 7/1991 | Little et al. . |
| 5,055,425 | 10/1991 | Leibovitz et al. . |
| 5,093,708 | 3/1992 | Solomon . |
| 5,104,820 | 4/1992 | Go et al. . |
| 5,111,278 | 5/1992 | Eichelberger . |
| 5,117,282 | 5/1992 | Salatino . |
| 5,128,831 | 7/1992 | Fox, III et al. . |
| 5,135,556 | 8/1992 | Hornback et al. . |
| 5,138,437 | 8/1992 | Kumamoto et al. . |
| 5,138,438 | 8/1992 | Masayuki et al. . |
| 5,172,303 | 12/1992 | Bernardoni et al. . |
| 5,191,404 | 3/1993 | Wu et al. . |
| 5,191,405 | 3/1993 | Tomita et al. . |
| 5,198,888 | 3/1993 | Sugano et al. . |
| 5,200,300 | 4/1993 | Leibovitz . |
| 5,202,754 | 4/1993 | Bertin et al. . |
| 5,221,642 | 6/1993 | Burns . |
| 5,222,014 | 6/1993 | Lin . |
| 5,229,647 | 7/1993 | Gnadinger . |
| 5,231,304 | 7/1993 | Solomon . |
| 5,247,423 | 9/1993 | Lin et al. . |
| 5,259,110 | 11/1993 | Bross et al. . |
| 5,270,261 | 12/1993 | Bertin et al. . |
| 5,270,571 | 12/1993 | Parks et al. . |
| 5,283,107 | 2/1994 | Bayer et al. . |
| 5,311,401 | 5/1994 | Gates, Jr. et al. . |
| 5,330,359 | 7/1994 | Walker . |

CONDUCTIVE EPOXY FLIP-CHIP PACKAGE AND METHOD

CROSS-REFERENCE TO RELATED PATENT APPLICATION

The present application is a continuation-in-part of application Ser. No. 08/265,081, entitled "Vertical Interconnect Process for Silicon Segments," filed on Jun. 23, 1994, and assigned to the assignee of the present application.

BACKGROUND OF THE INVENTION

The present invention relates to the production of memory modules, and more particularly to a method and apparatus for attaching integrated circuit chips to printed circuit boards.

There is an almost insatiable demand for additional semiconductor memory in personal computing applications. The usual practice is for systems manufacturers to ship personal computer systems with a minimum amount of memory installed and provide a way for the owners to add additional memory as their needs dictate. This protects the manufacturer from sometimes being on the wrong side of a price swing in the volatile semiconductor memory market and also lowers the price of the system being sold.

This practice creates a huge market for low cost, reliable memory modules that can be installed after the initial sale, either by users or other individuals that are not necessarily skilled in the art of computer hardware modification.

The physical need for this market has been met with memory modules such as the 88 pin Personal Computer Memory Card International Association (PCMCIA) card and a variety of Single In-line Memory Modules (known as SIMMs). These devices typically include a printed circuit board (PCB) and a number of discrete integrated circuit memory chips connected to the PCB in a manner that allows the PCB to be easily installed in a computer system.

One problem with the current technology is cost, since users are looking for the lowest cost solution to their memory storage needs. Current technology generally provides two methods of manufacturing memory modules. The most common method is to first package individual semiconductor chips into individual plastic packages, test each chip, and then attach the packages to a PCB, using a multi-step process. The multi-step process includes the steps of attaching the chips to a lead frame, connecting wires to the frame, injection molding the frame, plating the leads with tin, deflashing the molding compounds, bending the leads, testing the package, and so on. Obviously, this multi-step process is both cumbersome and expensive.

Another method for manufacturing memory modules is commonly referred to as "flip chip" technology, which utilizes solder balls to solder chips face-down on a substrate. Flip chips are typically used to create multichip memory modules. One disadvantage of conventional flip chips is that the thermal expansion/contraction properties of the materials used in the manufacturing process must be matched closely to prevent damage to the flip chips during use. Another disadvantage is that standard visual inspections cannot be performed on the flip chips, because the flip chips are attached face-down on the substrate, covering the connection with the substrate.

SUMMARY OF THE INVENTION

Accordingly, it is an object of the present invention to provide an improved method and apparatus for reducing the steps and cost associated with manufacturing multichip modules.

The present invention provides a method and apparatus for producing a multichip package comprising semiconductor chip and a substrate. The semiconductor chip includes conventional inner bond pads that are rerouted to other areas on the chip to facilitate connection with the substrate. The inner bonds are rerouted by covering the chip with a first insulation layer and opening the first insulation layer over the inner bond pads. A metal layer is then disposed over the first insulation layer in contact with the inner bond pads. A second insulation layer is disposed over the metal layer, and the second insulation layer is opened to expose selected portions of the metal layer to form external connection points. Electrically conductive epoxy is then disposed between the external connection points of the semiconductor chip and the terminals of the substrate, thereby electrically connecting the semiconductor chip to the substrate.

Other objects, features and advantages of the present invention will become apparent from the following detailed description when taken in conjunction with the accompanying drawings.

BRIEF DESCRIPTION OF THE DRAWINGS

The accompanying drawings, which are incorporated in and form a part of this specification, illustrate embodiments of the invention and, together with the following detailed description, serve to explain the principles of the invention.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Figure 1A:
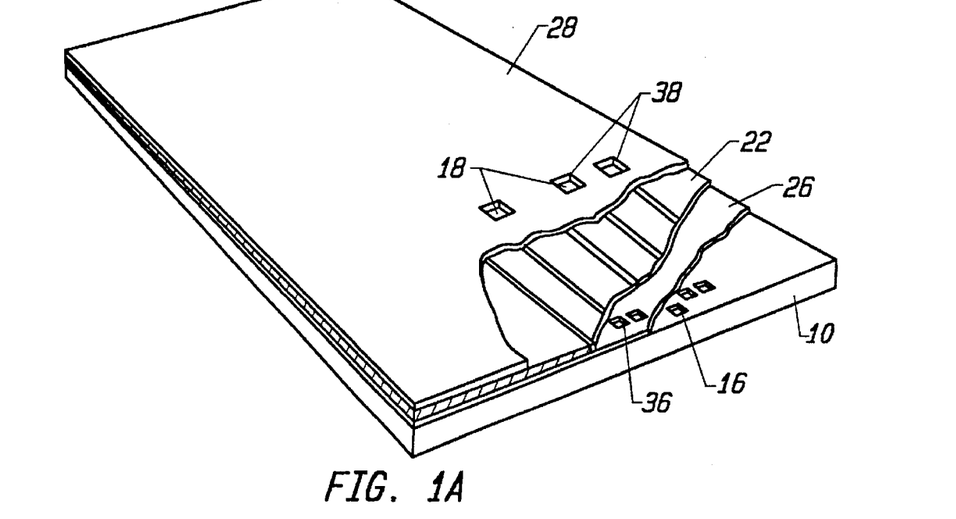
FIG. 1A is diagram illustrating a semiconductor chip according to a first preferred embodiment of the present invention.
Figure 1B:
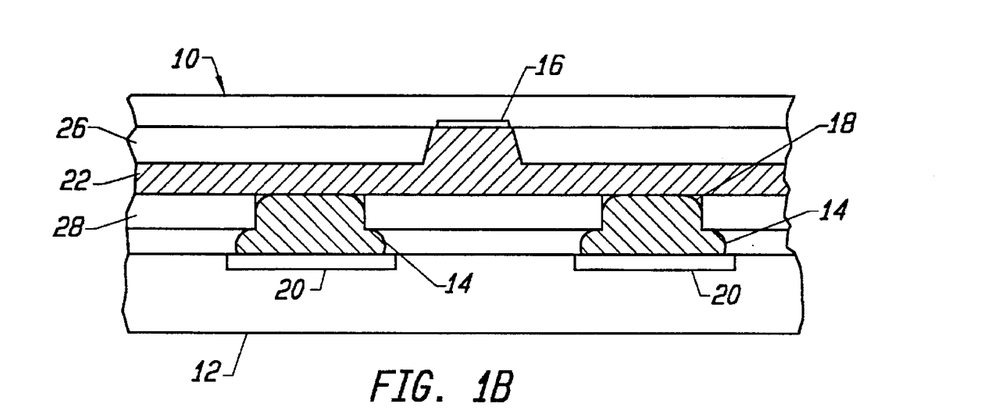
FIG. 1B is a cross-sectional view of a semiconductor chip that is attached face-down on a PCB using electrically conductive epoxy in accordance with one preferred embodiment of the present invention.

Referring to FIGS. 1A and 1B, a semiconductor chip 10 is shown according to one preferred embodiment of the present invention. FIG. 1A is a perspective cut-away view of the chip 10 before it is flipped over and attached to PCB 12. FIG. 1B is a cross-sectional view of the chip 10, which is attached face-down on PCB 12 using electrically conductive epoxy 14. The chip 10 includes inner bond pads 16 for supplying power and transmitting data to and from the chip 10 in a conventional manner. Because the inner bond pads 16 are usually positioned on the chip 10 in dimensions that are to small to allow low cost PCB technology to make reliable contact, the inner bond pads 16 are rerouted to the external connection points 18, which are positioned on the chip 10 with the appropriate size and space. The inner bond pads 16 are re-routed to other areas on the chip 10 using a layer of metal 22, which also forms external connection points 18. The conductive epoxy 14 is applied between the external connection points 18 on the chip 10 and terminals 20 on the PCB 12 to both attach and electrically connect the chip 10 to the PCB 12.

Figure 2:
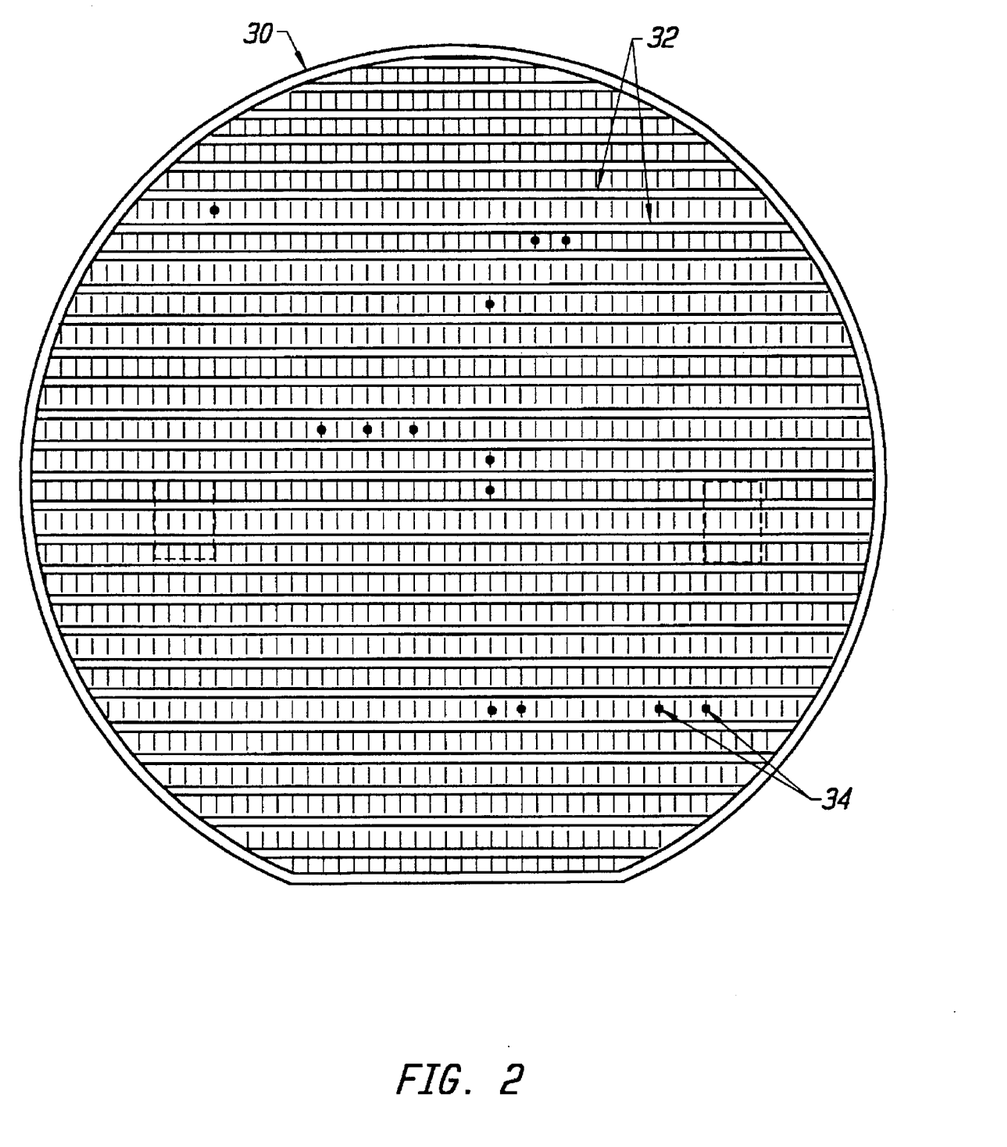
FIG. 2 is diagram illustrating a conventional silicon wafer.

Referring to FIG. 2, the process of rerouting inner bond pads 16 to the external connection points 18 of the present invention will be described, beginning with a standard wafer 30 which is supplied by a manufacturer. Semiconductor devices, such as memory chips 10, for example, are called "die" while in wafer form, and referred to as chips 10 once they are cut-out of the wafer 30. The squares on the wafer 30 indicate the locations of individual die 32 on the wafer 30. Wafers 30 normally arrive from the manufacturer with non-functioning or defective die which are marked with an ink dot 34. Typically, the wafer 30 is made of silicon, but alternate materials are also used, such as gallium arsenide for instance.

Referring to FIGS. 1A, 1B, and 2, the inner bond pads 16 on the chips 10 are usually covered with aluminum. The first step in the process of rerouting inner bond pads 16 to the external connection points 18 is to remove the aluminum from the inner bond pads 16 to prevent the formation of an undesirable gold/aluminum compound later on in the process. The aluminum is removed from the inner bond pads 16 using standard lithographic techniques. The wafer 30 is coated with photoresist and a slightly oversize image of the inner bond pads 16 is exposed using conventional masking techniques. The photoresist is developed away from the inner bond pads 16 and the aluminum is etched away using conventional semiconductor process techniques.

The next step in the process is to cover the entire wafer 30 with an insulating layer that usually comprises a liquid spin-on material. In a preferred embodiment, the wafer 30 is covered with a polyimide layer 26, although other materials such as spin-on glass, SiO2, Si3N4, etc. may also be used. A set of openings 36 are then made in the polyimide layer 26 over the inner bond pads 16 that are to be used in the final product. While there are many methods that can be used to make the openings 36, in a preferred embodiment, the openings 36 are made using conventional semiconductor processing techniques.

Next, a layer of metal layer 22 is applied to the surface of the wafer 30 and is patterned to allow signals from the inner bond pads 16 to be re-routed to the external contact points 18. Many well-known methods exist for the application and patterning of a metal interconnect layer. In the preferred embodiment of the present invention, a layer of photoresist (not shown) is applied to the wafer and a pattern is developed in the resist such that the resist is removed in the areas that define the intended path of the metal layer 22. After the photoresist is developed, the metal layer 22 is deposited on the chip 10. In a preferred embodiment, the metal layer 22 comprises a 2000 angstrom layer of chromium, a 500 angstrom layer of titanium tungsten, and a 1200 angstrom layer gold.

Once the metal layer 22 is applied to the chip 10, the metal layer 22 is patterned into a desired path by dissolving the photoresist remaining on the wafer 30, which causes the undesired metalization to float away with the dissolved photoresist. This is process is commonly known as a "lift-off" process.

After the metal layer 22 is patterned on the chip 10, the wafer 30 is covered with a second polyimide layer 28 for insulation. A second set of holes 38 are opened in the second polyimide layer 28 to expose the external contact points 18 formed by the metal layer 22.

Figure 3:
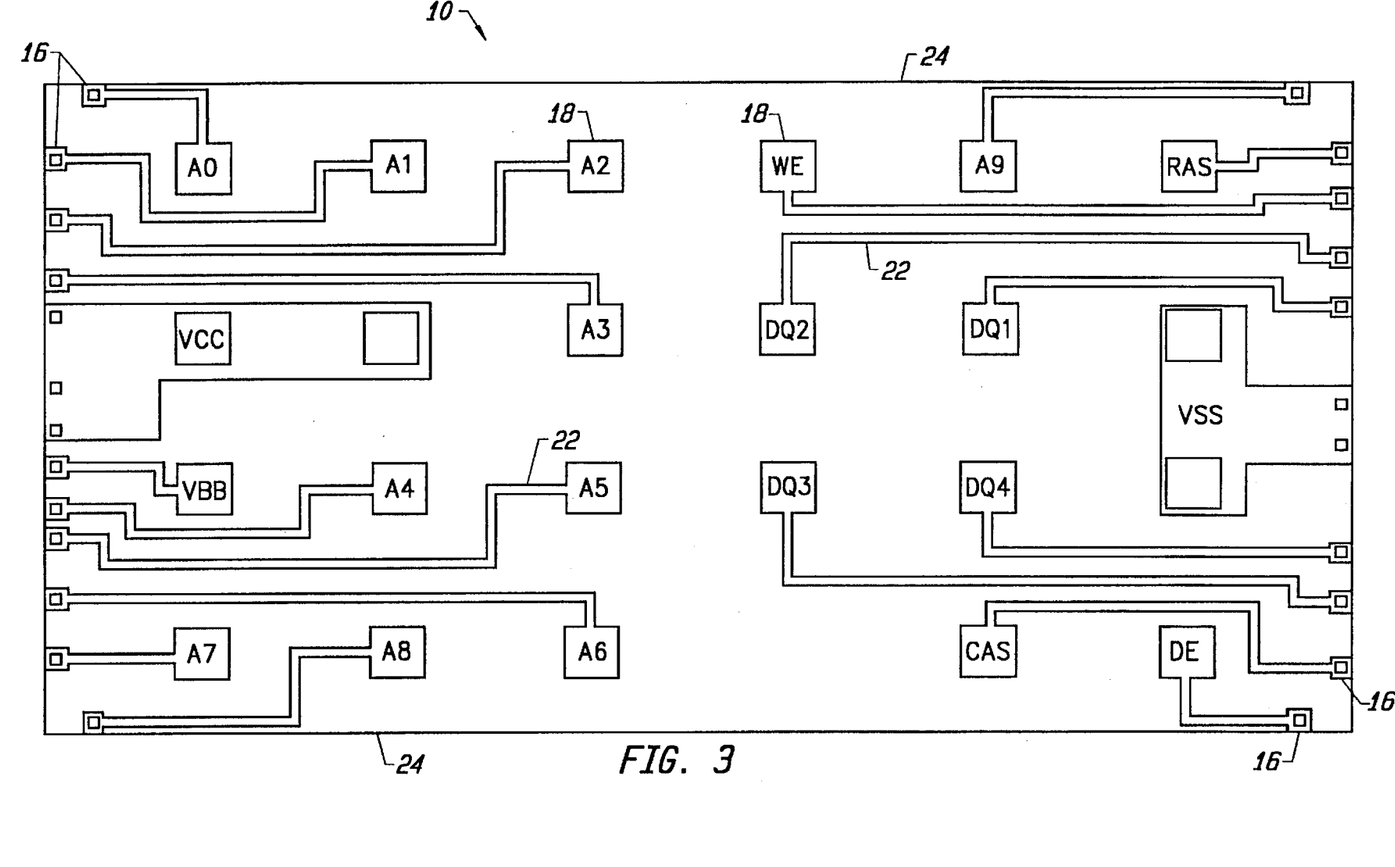
FIG. 3 is a top view of a chip showing the positions of external connection points according to the first preferred embodiment of the present invention.

Referring now to FIG. 3, the placement of the external connection points 18 on the chip 10 are shown according to the first preferred embodiment of the present invention. In the first preferred embodiment, the external connection points 18 are all positioned on the chip 10 internally from the edges 24 of the chip 10. The inner bond pads 16 included on the chips 10 act as connection points for the following standard signals: address (A0-A9), data (D1-D4), Row Address Strobe (RAS), Column Address Strobe (CAS), Write Enable (WE), Read Enable (OE), power (VCC), ground and ground (VSS).

As shown in FIG. 3, the layer of metal 22 functions to route each inner bond pad 16 to a corresponding external connection point 18 on the chip 10. The external connection points 18 are positioned with the appropriate size and spacing so that reliable and low-cost contact may be made with the external connection points 18 by the conductive epoxy 14 (FIGS. 1A and 1B).

Referring to FIGS. 1A, 1B and 2, after the first polyimide layer 26, the metal layer 22, and the second polyimide layer 26 are applied to the wafer 30, the die 32 are individual cut-out of the wafer 30. The die 32 that were identified as defective during the earlier testing are discarded. The die 32 are cut-out of the wafer 30 using conventional semiconductor wafer sawing and die-picking equipment. After the die 32 are cut-out, they are attached to a PCB 12 in order to create a memory module.

Figure 4:
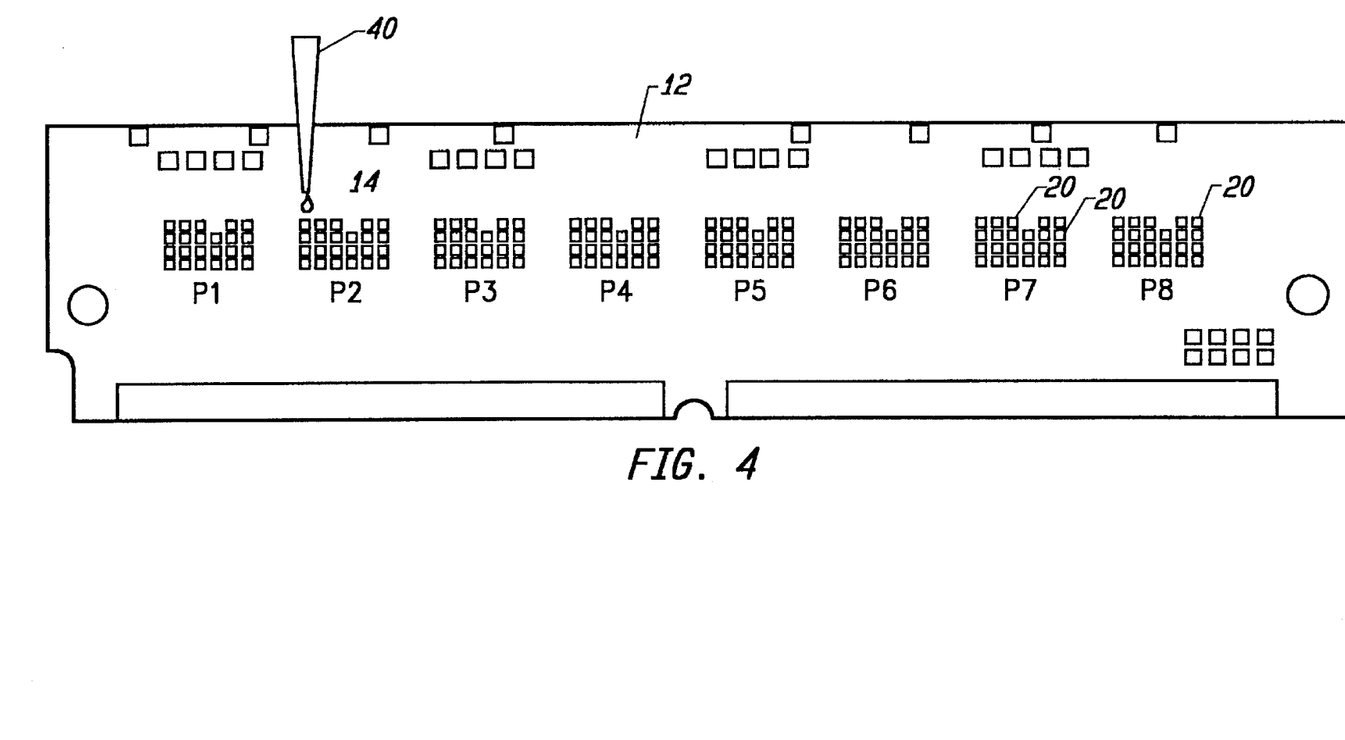
FIG. 4 is side view of a PCB, which is used to create a memory module according to the first preferred embodiment of the present invention.

FIG. 4 is side view of a PCB 12 used to create a memory module according to the first preferred embodiment of the present invention. The PCB 12 includes positions P1 through P8 for accepting eight chips 10 (FIG. 1A). Each chip position P1-P8 includes a plurality of terminals 20 corresponding to the locations of the external connection points 18 on the chips 10. In order to connect the external connection points 18 of the chips 10 to the terminals 20 on the PCB 12, a controlled amount of conductive epoxy 14 is dispensed on each terminal 20 using commercially available automated epoxy dispense equipment 40.

Referring again to FIGS. 1A and 1B, before a reliable connection can be made to the external connection points 18, the external connection points 18 must be mechanically abraded in such a manner as to create a surface that is rough enough prevent the conductive epoxy 14 from forming an insulating layer, but not so rough as to damage the fragile semiconductor surface of the chip 10. This is accomplished by covering the chips 10 with an abrasive material and then bringing a small artists paint brush alternately into and out of contact with the chips 10 in the region of the external contact points 18.

Referring to FIGS. 1A, 1B and 4, after the external connection points 18 are mechanically abraded, the chips 10 are placed in a fixture (not shown) that aligns the chips 10 with the eight chip positions P1–P8 on the PCB 12. Using the fixture, the chips 10 are then placed face-down on the PCB 12 in contact with the conductive epoxy 14 on the terminals 20. Spring pressure is applied to the fixture to insure that the chips 10 remains in contact with the conductive epoxy 14. After clamping, the entire assembly is heated to 120 C. for an hour to cure the conductive epoxy 14.

Figure 5:
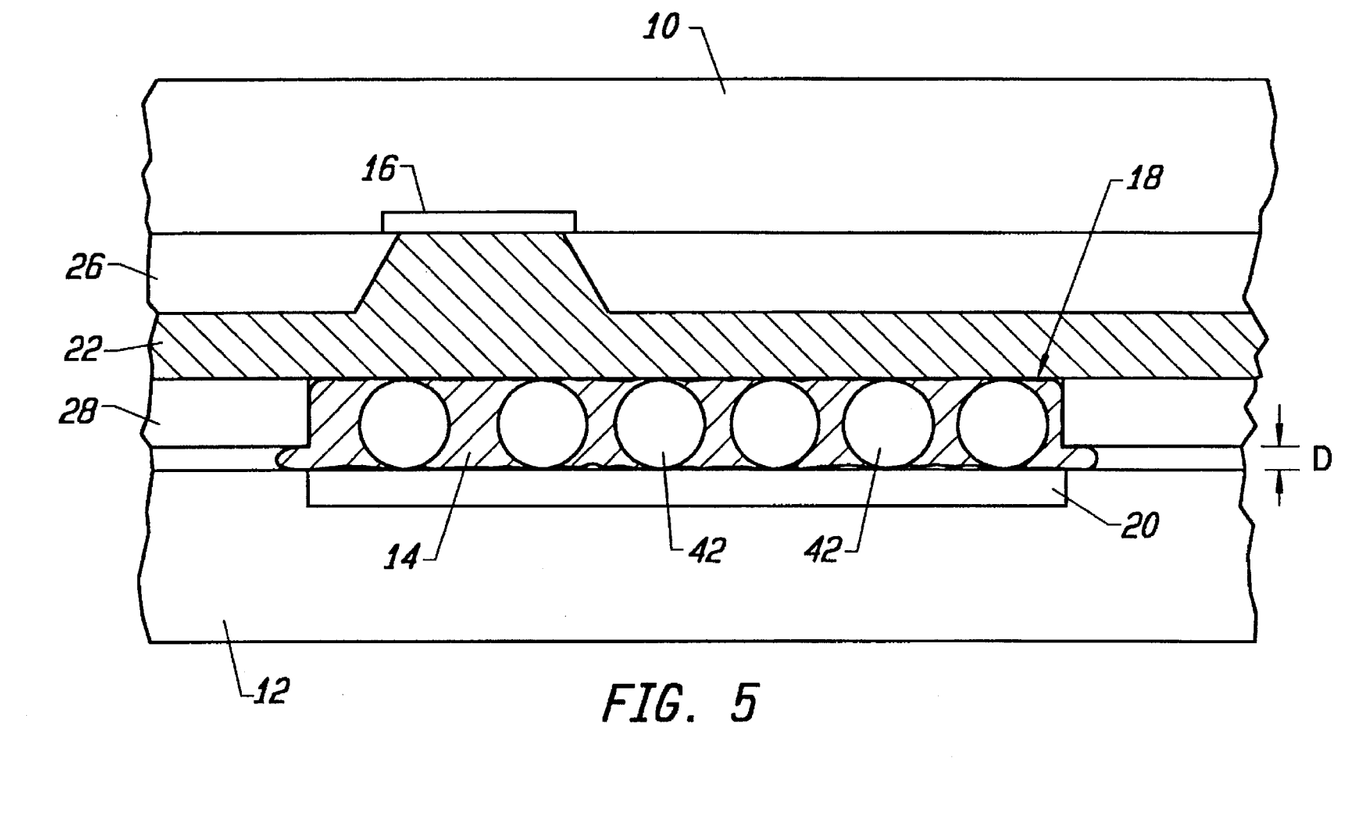
FIG. 5 is a diagram showing the inclusion of glass spheres 42 into conductive epoxy in order to maintain a distance between a chip and a PCB.

Referring now to FIG. 5, a cross-sectional view of a chip 10 is shown that has been attached to a PCB 12. A minimum bond line thickness is maintained between the chip 10 and a PCB 12 by mixing a small number of glass spheres 42 of a known size into the conductive epoxy 14, which lies between the external connection points 18 and the terminals 20. The glass spheres 42 are necessary to maintain a distance (D) between the chip 10 and the PCB 12. Otherwise, the chip 10 would be in contact with the PCB 12, and the different thermal expansion rates between the silicon in the chip 10 and the fiberglass of the of the PCB 12 could damage the chip 10 during use.

The conductive epoxy application of the present invention accomplishes the steps of both attaching chips 10 to a PCB 12 as well as electrically connecting the chips 10 to the PCB 12. Stated another way, the conductive epoxy 14 performs the function of both an adhesive and an electrical conductor.

After the chips 10 are attached to the PCB 12 with the conductive epoxy 14, the next step in the process is to burn-in (i.e. test) the PCB 12 by applying electrical power and input signals to the terminals 20 for an extended period of time at an elevated ambient temperature. Following the burn-in operation, the PCB 12 is subjected to an electrical test where its functional and parametric properties are tested. If one or more chips 10 are found to be electrically defective, then they are mechanically removed from the PCB 12. The terminals 20 under the defective chips 10 are cleaned-off, fresh conductive epoxy 14 is dispensed on the terminals 20, and a new chips 10 are placed in the terminals 20.

After the PCB 12 is tested, the chips 10 on the PCB 12 are covered with a conformal coating that will protect the chips 10 from mechanical and chemical damage. In a preferred embodiment, non-conductive epoxy (not shown) is dispensed over the entire surface and around the perimeter of each chip 10, such that there are no exposed areas of silicon. The non-conductive epoxy is then cured at 60° C. for 3 hours. The final step is to perform a minor electrical test on the PCB 12 and the PCB 12 is then packed for shipment.

Figure 6:
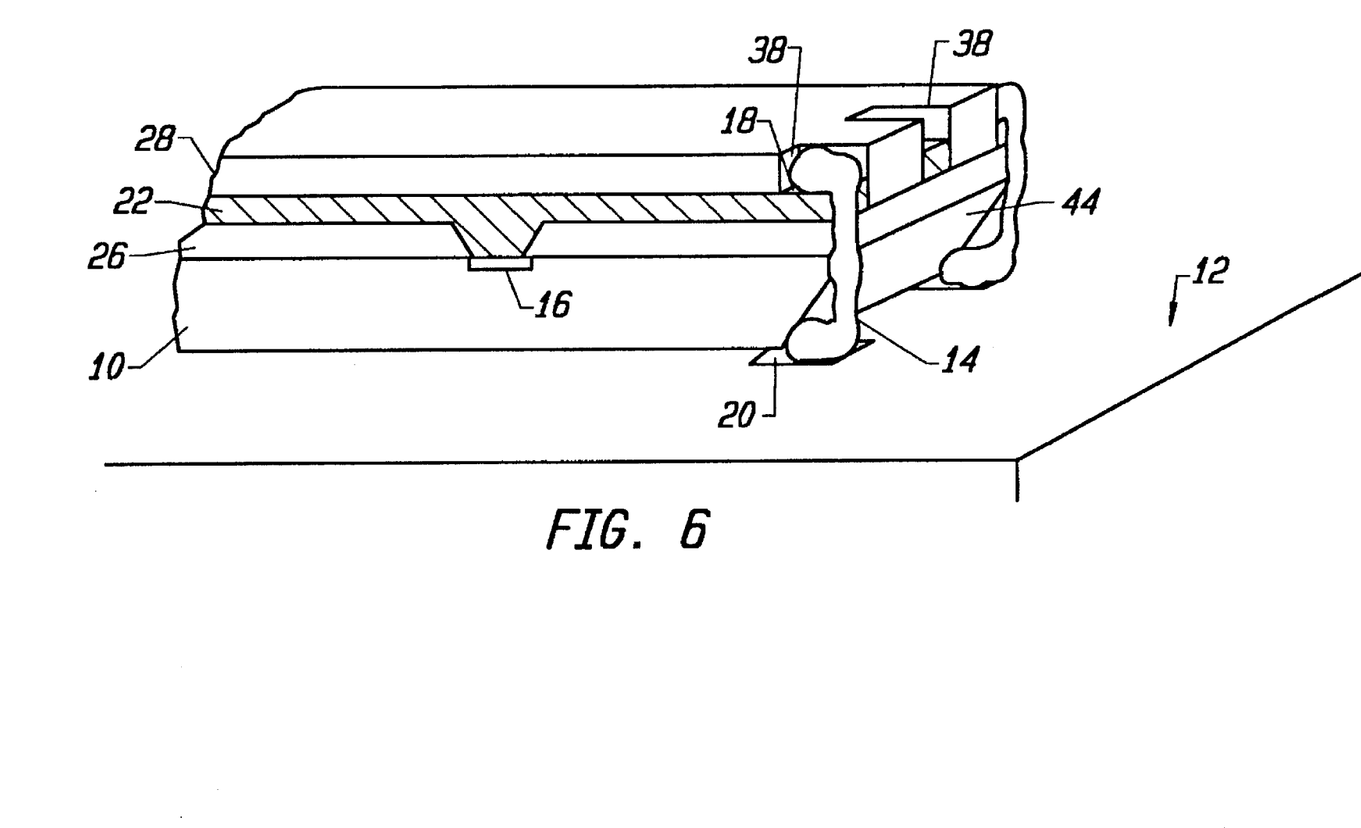
FIG. 6 is a diagram depicting a semiconductor chip attached face-up on a PCB using electrically conductive epoxy in accordance with a second preferred embodiment of the present invention.

Referring now to FIG. 6, a second preferred embodiment of attaching a chip 10 to a PCB 12 using electrically conductive epoxy 14 is shown. Instead of plading the chip 10 face-down on the PCB 12, the chip 10 is placed face-up on the PCB 12. As described in the first embodiment, the chip 10 is first covered with a polyimide layer 26 for insulation. The polyimide layer 26 supports the metal layer 22, which reroutes the inner bond pads. 16 of the chip 10 to the external connection points 18. A second polyimide layer 28 covers and insulates the metal layer 22, and a second set of openings 38 are made in the second polyimide layer 28 over the external connection points 18. Conductive epoxy 14 is then dispensed on the external connection points 18, down a beveled edge wall 44 of the chip 10, and on the terminals 20 of the PCB 12, which are located beneath the external contact points 18.

Besides being placed face-up on the PCB 12, the chip 10 of the second preferred embodiment differs from the chip 10 of the first embodiment with respect to 10 the positioning of the external contact points 18 on the chip 10.

Figure 7:
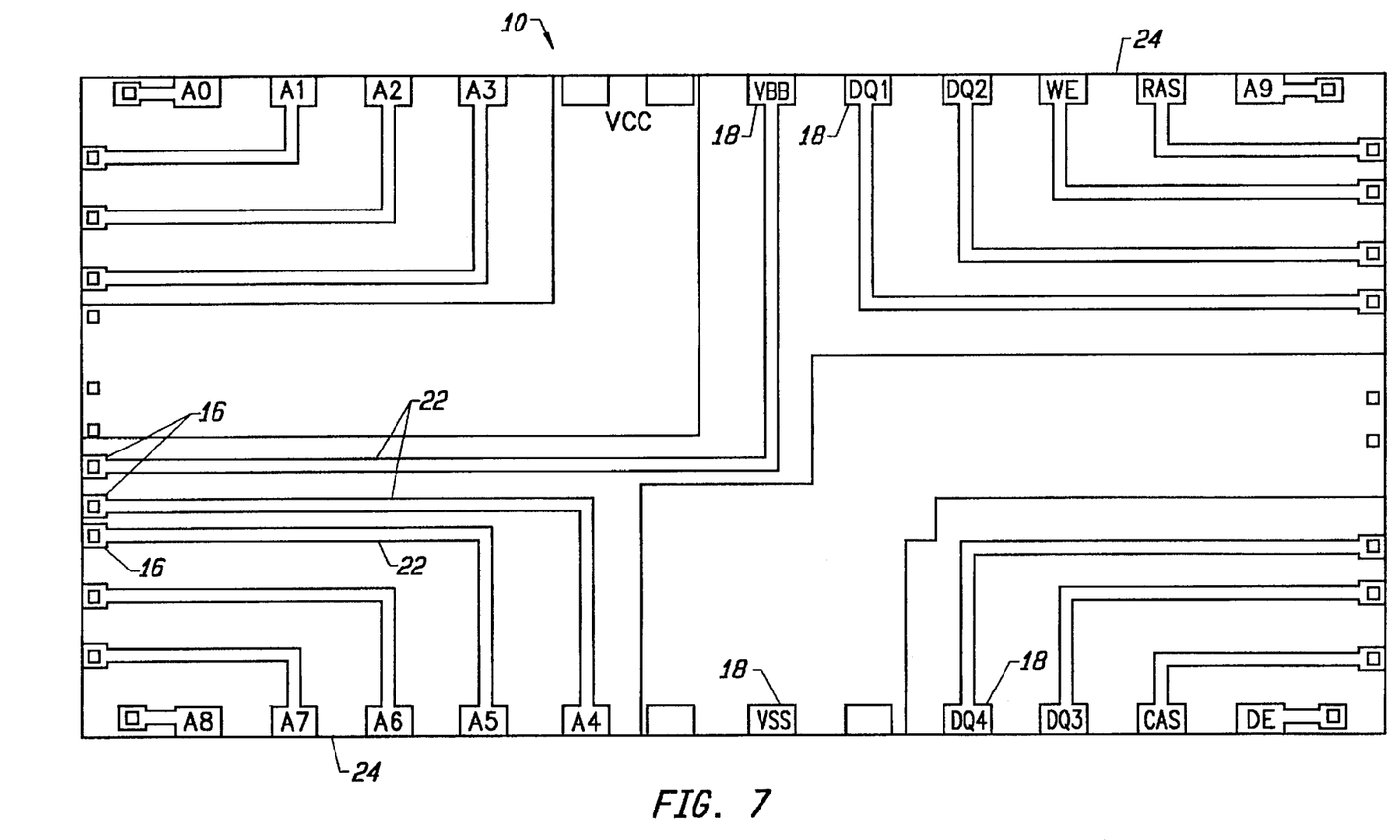
FIG. 7 is a top view of a chip depicting the positions of external connection points according to the second preferred embodiment of the present invention.

Referring now to FIG. 7, the placement of the external connection points 18 on the chip 10 are shown according to the second preferred embodiment of the present invention. In this preferred embodiment, the external connection points 18 are positioned along the edges 24 of the chip 10. As in the first embodiment, the layer of metal 22 functions to route each inner bond pad 16 to a corresponding external connection point 18 on the chip 10. The chip 10 includes the same standard inner bond pads 16 as the chip 10 shown in FIG. 3: address (A0–A9), data (D1–D4), Row Address Strobe (RAS), Column Address Strobe (CAS), Write Enable (WE), Read Enable (OE), power (VCC), ground and ground (VSS).

Although the external connection points 18 are shown in FIG. 7 along two edges of the chip 10, the external connection points 18 may be located on any number of edges 24 defining the chip 10. The external connection points 18 may even occupy the same edge of the chip 10 that is occupied by the inner bond pads 16. This is accomplished by forming the layer of metal 22 into the external connection points 18 directly over the inner bond pads 16.

Referring to both FIGS. 2 and 6, the beveled edge wall 44 on the chip 10 is created by cutting the die 32 out of the wafer 30 using a saw blade (not shown) that has an angled cutting surface. Instead of cutting the die 32 from the front, the wafer 30 is sawn through from the back. The result is a beveled edge wall 44 that starts at the outer edge 24 of the chip 10 and slopes back toward the center of the chip 10 along all four edges 24 of the chip 10.

After the chip 10 is cut-out of the wafer 30, an insulating layer, such as silicon nitride, is sputtered on the back side of the chip 10 so as to cover the entire backside of the chip 10 including the beveled edges 44. The purpose of this step is to electrically insulate the semiconductor chip 10 from the conductive epoxy 14 that will be applied between the chip 10 and the PCB 12. Without the insulating layer, the epoxy 14 would contact both the terminals 20 on the PCB 12 and the silicon of the chip 10, which would short the chip 10.

One purpose of the beveled edge walls 44 on the chip 10 is to facilitate the sputtering of the silicon nitride along the sides of the chip 10. The silicon nitride could also be applied to the sides of the chip 10 without the beveled edge walls 44. After the back side of the chip 10 is insulated, the chip 10 is attached to a PCB 12.

Figure 8:
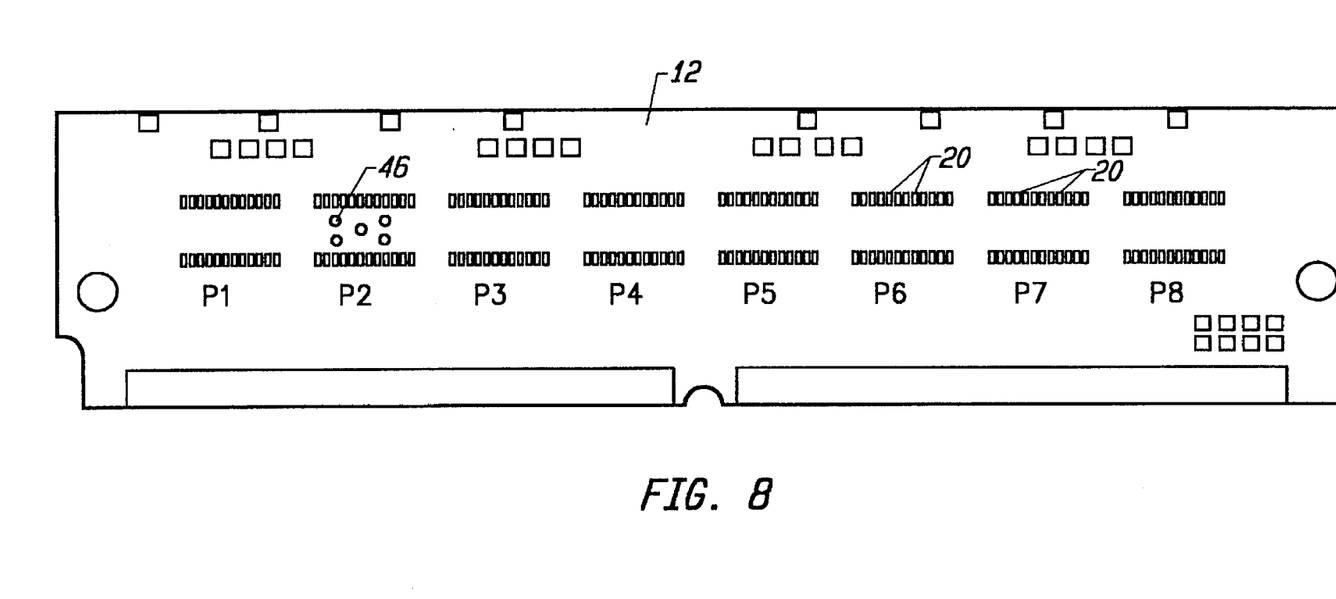
FIG. 8 is side view of a PCB, which is used to create a memory module according to the second preferred embodiment of the present invention.

FIG. 8 is side view of a PCB 12 used to create a memory module according to the second preferred embodiment of the present invention. The PCB 12 includes positions P1 through P8 for accepting eight chips 10. As shown, the terminals 20 in positions P1–P8 are located corresponding to the locations of the external connection points 18 on the chips 10 once the chips 10 are placed on the PCB 12.

To attach the chips 10 to the PCB 12, a conventional surface mount adhesive 46 is dispensed in between the terminals 20 where the chips 10 are to be attached. The chips 10 are placed in a fixture (not shown) that aligns the chips 10 with the positions P1–P8 on the PCB 12, and the chips 10 are then placed on the adhesive with enough force to insure a good adhesive bond.

Figure 9:
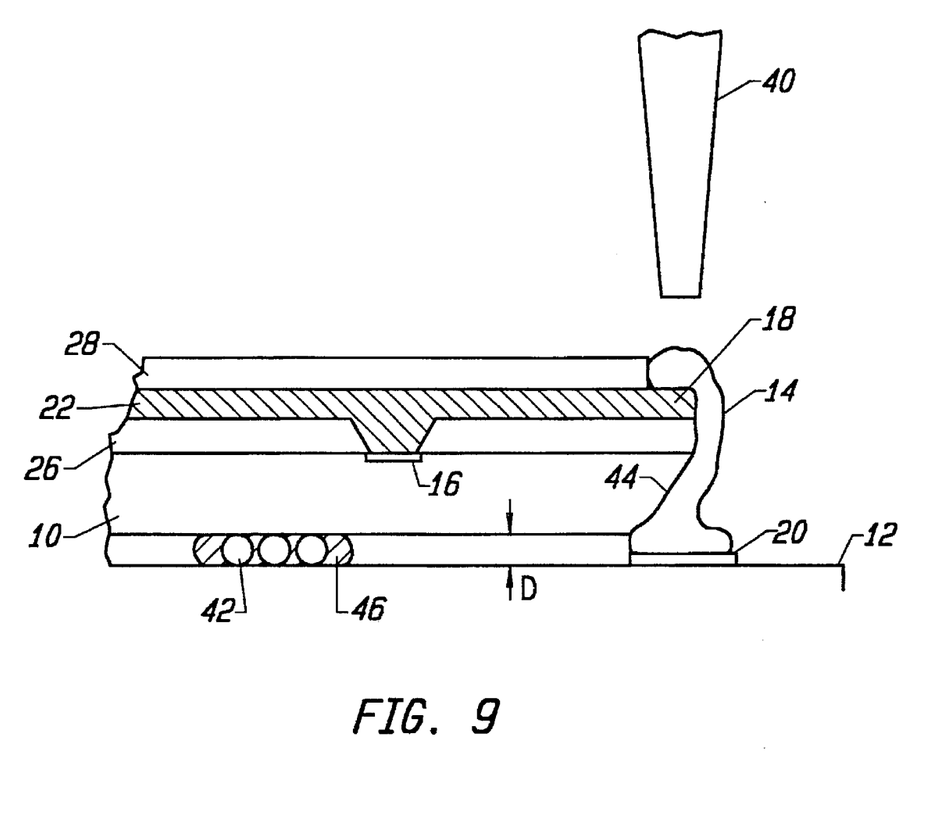
FIG. 9 is a diagram showing the inclusion of glass spheres 42 into surface mount adhesive, which is used to attach a chip to a PCB.

Referring to FIG. 9, a side view of a chip 10 attached to a PCB 12 is shown. According to one aspect of the present invention, the bond line thickness between the chips 10 and the PCB 12 is controlled by adding glass spheres 42 of the appropriate diameter to the surface mount adhesive 46. As shown, the glass spheres 42 maintain a distance (D) between the chip 10 and the PCB 12 in order to account for different thermal expansion rates between the chip 10 and the PCB 12. After the chips 10 are placed in contact with the surface mount adhesive 46, the surface mount adhesive 46 is cured for 10 minutes at 60° C.

After the surface mount adhesive 46 is cured, conductive epoxy 14 is dispensed between each of the external contact points 18 and the terminals 20 on the PCB 12. This is accomplished with conventional X/Y liquid dispense mechanism 40. The conductive epoxy 14 is then cured at 120° C. for 60 minutes.

As in the first embodiment, the last step is to coat all the chips 10 on the PCB 12, test the PCB 12, and then pack the PCB 12 for shipment.

This second embodiment has the advantage of allowing each connection between the external contact points 18 and the terminals 20 to be visually inspected, since the chips 10 are attached face-up.

In summary, a method and apparatus has been disclosed that attaches chips 10 to a substrate using conductive epoxy 14, thereby reducing the steps and cost associated with producing memory modules.

The foregoing descriptions of specific embodiments of the present invention have been presented for purposes of illustration and description. They are not intended to be exhaustive or to limit the invention to the precise forms disclosed, and it should be understood that many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A semiconductor chip package, comprising:
   a substrate having a plurality of terminals;
   a semiconductor chip on said substrate, said semiconductor chip including,
     a plurality of inner bond pads,
     a first insulation layer covering said chip,
     a first plurality of holes in said first insulation layer exposing said inner bond pads,
     a metal layer disposed over said first insulation layer to form an electrical contact with said inner bond pads,
     a second insulation layer disposed over said metal layer, and
     a second plurality of holes in said second insulation layer exposing selected portions of said metal layer to form external connection points;
   electrically conductive epoxy disposed between said external connection points of said semiconductor chip and said terminals of said substrate, thereby electrically connecting said semiconductor chip to said substrate, and
   glass sphere means disposed between said external connection points and said terminals for maintaining a minimum bond thickness between said chip and said substrate.

2. A semiconductor chip package as in claim 1, wherein said substrate is a printed circuit board.

3. A semiconductor chip package as in claim 2, wherein said semiconductor chip includes four edges and said external contact points are located on said semiconductor chip internally from said edges.

4. A semiconductor chip package as in claim 1, wherein said semiconductor chip is disposed on said substrate face-down such that said external connection points are positioned directly above said terminals on said substrate.

5. A semiconductor chip package as in claim 1, wherein said semiconductor chip is disposed on said substrate face-up such that said external connection points face-away from said terminals on said substrate.

6. A semiconductor chip package as in claim 5, wherein said semiconductor chip includes four edges and said external contact points are located along the edges of said semiconductor chip.

7. A semiconductor chip package as in claim 6, wherein said semiconductor chip includes beveled edge walls and said electrically conductive epoxy extends down from said external contact points along said beveled edge walls to said terminals on said substrate.

8. A method for producing a multichip package, said method comprising the steps of:
   providing inner bond pads on said chip;
   covering said chip with a first insulation layer;
   forming a first plurality of holes in said first insulation layer to expose said inner bond pads;
   disposing a metal layer over said first insulation layer such that said metal layer is in electrical contact with said inner bond pads;
   disposing a second insulation layer over said metal layer;
   exposing selected portions of said metal layer to form external connection points;
   providing a substrate having a plurality of terminals;
   disposing conductive epoxy between said external connection points of said chip and said terminals of said substrate to electrically connect said chip to said substrate, and
   providing glass sphere means disposed between said external connection points and said terminals for maintaining a minimum bond thickness between said chip and said substrate.

9. A method as in claim 8, further comprising the step of disposing said chip is on said substrate face-down such that said external connection points are positioned directly above said terminals on said substrate.

10. A method as in claim 9, further comprising the steps of:
    providing said chip with four edges; and
    forming said external contact points on said chip internally from said edges.

11. A method as in claim 8, further comprising the step of disposing said chip face-up on said substrate such that said external connection points face-away from said terminals on said substrate.

12. A method as in claim 11, further comprising the steps of:
    providing said chip with four edges; and
    forming said external contact points along the edges of said chip.

13. A method as in claim 12, further comprising the steps of:
    providing said chip with beveled edge walls; and dispensing said electrically conductive epoxy from said external contact points along said beveled edge walls to said terminals on said substrate.

14. A flip-chip package, comprising:
a printed circuit board having a plurality of terminals;
a flip-chip including,
four edges;
a plurality of inner bond pads,
a first insulation layer covering said flip-chip,
a first plurality of holes in said first insulation layer exposing said inner bond pads,
a metal layer disposed over said first insulation layer in electrical contact with said inner bond pads
a second insulation layer disposed over said metal layer, and
a second plurality of holes in said second insulation layer exposing selected portions of said metal layer to form external connection points, said external connection points being located on said flip-chip internally from said edges;
said flip-chip disposed on said printed circuit board face-down such that said external connection points are positioned directly above said terminals on said printed circuit board;
electrically conductive epoxy disposed between said external connection points of said flip-chip and said terminals of said printed circuit board, thereby electrically connecting said chip to said printed circuit board, and
glass sphere means disposed between said external connection points and said terminals for maintaining a minimum bond thickness between said chip and said substrate.

15. A chip package, comprising:
a printed circuit board having a plurality of terminals;
a chip including,
four edges;
a plurality of inner bond pads,
a first insulation layer covering said chip,
a first plurality of holes in said first insulation layer exposing said inner bond pads,
a metal layer disposed over said first insulation layer in electrical contact with said inner bond pads
a second insulation layer disposed over said metal layer,
a second plurality of holes in said second insulation layer exposing selected portions of said metal layer to form external connection points, said external connection points being located along said edges of said chip, and
beveled edge walls located at the outer edges of said chip and sloping toward the center of said chip;
said chip disposed on said printed circuit board face-up; and electrically conductive epoxy disposed along said beveled edge walls between said external contact points of said chip and said terminals of said printed circuit board, thereby electrically connecting said chip to said printed circuit board, and
glass sphere means disposed between said external contact points and said terminals for maintaining a minimum bond thickness between said chip and said substrate.

\* \* \* \* \*